United States Patent [19]

Fahrenschon

[11] Patent Number: 4,729,165
[45] Date of Patent: Mar. 8, 1988

[54] METHOD OF APPLYING AN INTEGRATED CIRCUIT ON A SUBSTRATE HAVING AN ELECTRICALLY CONDUCTIVE RUN

[75] Inventor: Kurt Fahrenschon, Pfaffenhofen, Fed. Rep. of Germany

[73] Assignee: Licentia Patent-Verwaltungs GmbH, Fed. Rep. of Germany

[21] Appl. No.: 910,989

[22] Filed: Sep. 23, 1986

[30] Foreign Application Priority Data

Sep. 27, 1985 [DE] Fed. Rep. of Germany ....... 3534502

[51] Int. Cl.⁴ ............................................... H05K 3/10
[52] U.S. Cl. ..................................... 29/846; 174/68.5; 228/180.2; 427/96
[58] Field of Search ................. 29/840, 832, 846, 839, 29/589; 174/68.5; 228/180.2; 339/17 CF; 427/96

[56] References Cited

U.S. PATENT DOCUMENTS

| | | |
|---|---|---|
| 3,614,832 | 10/1971 | Chance ............................ 29/846 X |
| 3,838,984 | 10/1974 | Crane et al. . |
| 4,038,744 | 8/1977 | Cheype et al. .................... 427/96 X |
| 4,184,043 | 1/1980 | Hildering ......................... 427/96 X |
| 4,631,820 | 12/1986 | Harada et al. ................. 174/68.5 X |
| 4,635,354 | 1/1987 | Chrobak et al. ............. 228/180.2 X |

FOREIGN PATENT DOCUMENTS

| | | |
|---|---|---|
| 103889 | 10/1985 | European Pat. Off. . |
| 3243227 | 5/1984 | Fed. Rep. of Germany . |
| 2535110 | 4/1984 | France . |
| 59-124322 | 7/1984 | Japan ..................................... 29/832 |

Primary Examiner—Howard N. Goldberg
Assistant Examiner—Carl J. Arbes
Attorney, Agent, or Firm—McGlew and Tuttle

[57] ABSTRACT

A method for producing adhesive contacting of an IC on a substrate of a LC cell, comprising suspending the leads of the IC, in the opening of an insulating frame by means of the leads surrounding the leads with conductive adhesive and adhesively securing them on the substrate by means of the frame.

7 Claims, 3 Drawing Figures

METHOD OF APPLYING AN INTEGRATED CIRCUIT ON A SUBSTRATE HAVING AN ELECTRICALLY CONDUCTIVE RUN

FIELD AND BACKGROUND OF THE INVENTION

From German patent OS No. 32 43 227, it is already known how to attach integrated circuits (ICs) by means of an adhesive on the substrate of a liquid crystal display cell (LC cell). It is further known therefrom how to electrically connect the conductor runs of components carrying IC's to the conductor runs on the substrate of the LC cell by means of an electroconductive adhesive.

SUMMARY OF THE INVENTION

The present invention provides a method, suitable in particular for automated manufacture, for the application and contacting of ICs on substrates consisting in particular of glass.

In accordance with the method of the invention, an integrated circuit is applied on a substrate which has an electric conductor run by suspending a liquid crystal display cell, in such a way that an electric contact is established between the conductor runs of the substrate and the conductor ribbons of the integrated circuit and using a frame of insulating material and self-supporting conductor ribbons. With the invention conductor ribbons are applied to the frame and the frame is pressed onto a support bearing a conductive adhesive layer in such a way that essentially only the regions of the conductor ribbons of the integrated circuit which are present on the surface of the frame are wetted with conductive adhesive. The frame is transferred with the integrated circuit and with the conductor ribbons wetted with adhesive onto the substrate in position so that the adhesive wetted conductor ribbons are pressed onto correspondingly arranged conductor run parts of the substrate. The adhesive is then permitted to harden or become cured so that a durable electrical connection between the conductor ribbons of the integrated circuit and the conductor runs of the substrate is established.

By the use of a frame of insulating material, in the opening of which the IC is freely suspended by its conductor ribbons, it is possible in a simple manner to provide the conductor ribbons at the desired points with conductive adhesive and to bring the IC to the desired point on the substrate and to electrically connect the conductor ribbons with the conductor runs on the substrate.

Accordingly, it is an object of the invention to provide an improved method for applying an integrated circuit which is suspended in the opening of a frame of insulating material by means of self-supporting conductor ribbons onto the surface of the substrate.

A further object of the invention is to provide a method which is simple to execute and inexpensive to carry out.

GENERAL DESCRIPTION OF THE PREFERRED EMBODIMENTS

Figure 1:
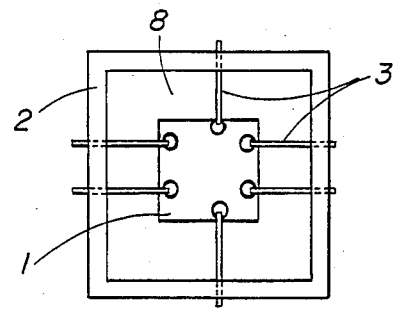
FIG. 1 is a top view of an integrated circuit having six conductor ribbons freely suspended in the opening of a frame 2 of insulating material.

Referring to the drawings, in particular, the method of applying an integrated circuit onto the surface of a substrate provided with electrical conductor runs begins by suspending conductor ribbons 3 in the opening of a frame 2, as shown in FIG. 1.

In FIG. 1, an IC 1 which by means of six conductor ribbons 3 is freely suspended in the opening 8 of a frame 2 of insulating material. The frame 2 may be a stamped (punched-out) part of an insulating tape on which a plurality of ICs are delivered ready made. As is known, the individual ICs are then singled by stamping. The conductor ribbons 3 are applied e.g. by thin copper strips which are already soldered to or bonded on the contacts of the IC.

Figure 2:
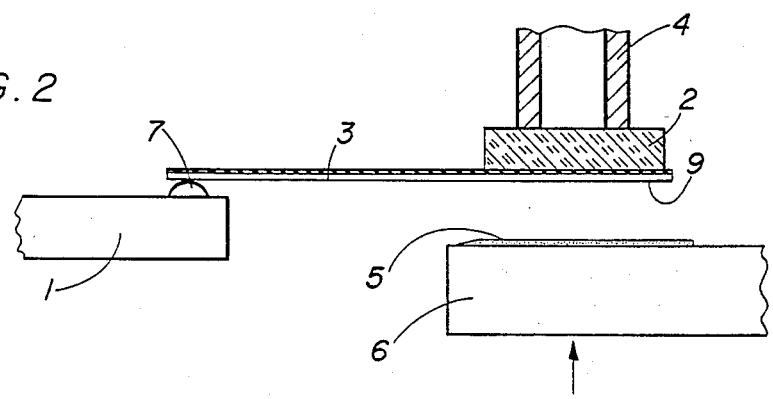
FIG. 2 is an enlarged side elevational view indicating the points of the conductor ribbons which are provided with a thin layer of conductive adhesion in accordance with the method of the invention.

FIG. 2 shows how the desired points 9 of the conductor ribbons 3 are provided with a thin layer of a conductive adhesive below the insulating frame 2.

By means of tool 4, which is preferably a suction tool which holds the frame sucked on by vacuum, the frame 2 is brought to a support 6, on which is present at the desired points an adhesive layer 5 of a thickness as true to dimension as possible, in a still soft state. The IC1 is moved along, as the ribbons 3 are connected by the contact connections 7 with the IC and also with the frame 2, e.g. by gluing or welding. By application of the frame 2 on the moist adhesive layer 5 essentially only the region 9 of the conductor ribbon 3 below frame 2 is wetted with adhesive, as only in this region adequate pressure can be exerted. The ribbons 3, in fact, are relatively thin and flexible, e.g. 25 $\mu$m thick. The adhesive layer 5 is preferably thinner than the thickness of the ribbon, e.g 15 $\mu$m thick. It can thereby be avoided that with a large-area adhesive layer 5 also the surfaces of frame 2 present between the ribbons 3 are wetted, which would lead to undesired short-circuits.

After the wetting of the desired regions 9 of the ribbons with the conductive adhesive 5, frame 2 and hence the IC1 is now transferred by means of the tool 4 onto substrate or glass plate 11 of the LC cell and pressed on at the desired point, whereby at the same time the desired electrical connections with the conductor runs 15 are produced on the substrate 11 of the LC cell.

Figure 3:
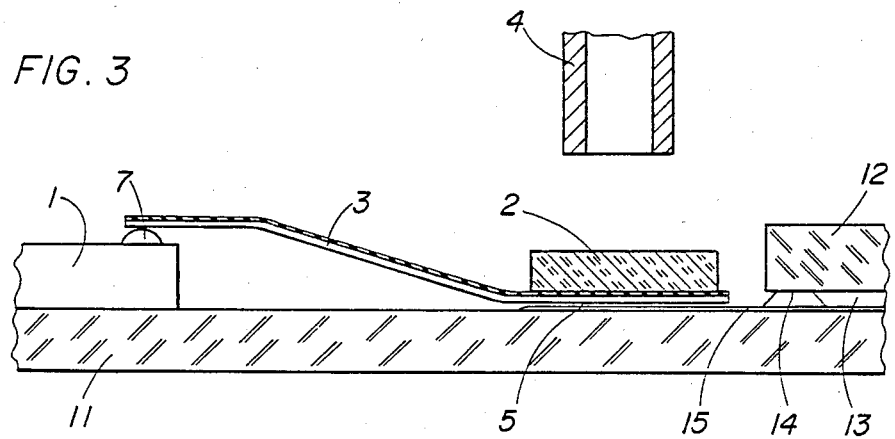
FIG. 3 is a side elevational view on a large scale of a finished construction.

FIG. 3 shows the finished construction after removal of tool 4. The LC cell comprises two glass plates 12 and 11, between which the LC material 13 is located. By lutings 14 the liquid crystal material is enclosed. The conductor runs 15 are located on the substrate 11 and are brought out the interior of the LC cell through the lutings 14. Substrate 11 is larger than substrate 12 and is provided with appropriate conductor runs and contacts for direct application of the driving ICs. The regions 9 of the ribbons 3, wetted with the moist adhesive, are pressed onto the conductor runs 15 of the LC cell and hence glued on in an electrically contacted manner, after the adhesive is set or hardened. If desired, the LC1 may further be fastened on the substrate 11, secured against vibrations, by additional means, s e.g. adhesives. The remaining insulating frame 2 constitutes a permanent protection of the glued contact points.

While a specific embodiment of the invention has been shown and described in detail to illustrate the application of the principles of the invention, it will be understood that the invention may be embodied otherwise without departing from such principles.

What is claimed is:

1. Method of applying an integrated circuit onto a substrate having a plurality of electrical conductor runs, comprising suspending the IC in the opening of a frame of insulating material by means of self-supporting conductor ribbons, said integrated circuit being applied on the surface of a substrate provided with electrical conductor runs of a liquid crystal display-cell, in such a way that an electric contact is established between the conductor runs of the substrate and the conductor ribbons of the integrated circuit and including compressing the frame having the surface on which the conductor ribbons of the integrated circuit are fastened onto a support bearing a conductive adhesive layer in such a way that essentially only the regions of the conductor ribbons of the integrated circuit which are present on the surface of the frame are wetted with conductive adhesive, transferring the frame with the integrated circuit and with the conductor ribbons wetted with adhesive onto the substrate and positioning the frame so that the adhesive wetted conductor ribbons are pressed onto the correspondingly arranged conductor run parts of the substrate, and permitting the adhesive to harden so that a durable electrical connection between the conductor ribbons of the integrated circuit and the conductor runs of the substrate is established.

2. A method according to claim 1, wherein the substrate comprises a glass plate serving as a cover plate of the liquid crystal cell.

3. A method according to claim 1, wherein a substrate is used whose conductor runs are thinner than 10 $\mu m$.

4. A method according to claim 1, wherein a substrate is used whose conductor runs are thinner than 6 $\mu m$.

5. A method according to claim 1, wherein to receive adhesive the conductor ribbons of the integrated circuit are pressed onto an adhesive layer which is thinner than the thickness of the conductive ribbons.

6. A method according to claim 1, wherein the adhesive layer of the support comprises several discrete layer areas occupying discrete areas of the support, the discrete layer areas are applied on the surface of the support in accordance with the location of the desired contact points.

7. A method according to claim 1, wherein the frame covers the adhesion connection areas so as to form a protection for the adhesion connection areas.

* * * * *